(12) United States Patent
Sutardja et al.

(10) Patent No.: US 7,939,414 B1
(45) Date of Patent: May 10, 2011

(54) ION IMPLANTATION AND PROCESS SEQUENCE TO FORM SMALLER BASE PICK-UP

(75) Inventors: Pantas Sutardja, Los Gatos, CA (US); Albert Wu, Palo Alto, CA (US); Chien-Chuan Wei, Sunnyvale, CA (US); Runzi Chang, San Jose, CA (US); Winston Lee, Palo Alto, CA (US); Peter Lee, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/897,603

(22) Filed: Oct. 4, 2010

Related U.S. Application Data

(62) Division of application No. 12/056,052, filed on Mar. 26, 2008, now Pat. No. 7,807,539.

(60) Provisional application No. 60/908,026, filed on Mar. 26, 2007.

(51) Int. Cl.
*H01L 21/8222* (2006.01)
*H01L 21/331* (2006.01)

(52) U.S. Cl. ........ 438/309; 438/141; 438/189; 438/318; 438/331; 438/350; 257/E21.35; 257/E21.352; 257/E21.361

(58) Field of Classification Search ............. 257/E21.35, 257/E21.352, E21.361
See application file for complete search history.

(56) References Cited

U.S. PATENT DOCUMENTS

| | | | | |
|---|---|---|---|---|
| 6,797,587 | B1 * | 9/2004 | Yang et al. | 438/424 |
| 6,969,901 | B1 * | 11/2005 | Pan et al. | 257/500 |
| 7,087,488 | B2 * | 8/2006 | Wu | 438/257 |
| 7,618,871 | B2 | 11/2009 | Meinhardt et al. | |
| 2004/0227213 | A1 | 11/2004 | Chen | |
| 2006/0022278 | A1 * | 2/2006 | Pan et al. | 257/369 |
| 2007/0278515 | A1 | 12/2007 | Hurst | |
| 2007/0278612 | A1 | 12/2007 | Williams et al. | |

* cited by examiner

*Primary Examiner* — Charles D Garber
*Assistant Examiner* — Mohsen Ahmadi

(57) ABSTRACT

Methods for forming a bipolar junction transistor device are described herein. A method for forming the bipolar junction transistor device may include doping a first portion of a substrate with a first dopant to form a base pick-up region, and after doping the first portion of the substrate, doping a second portion of the substrate with a second dopant to form at least one emitter region. A bipolar junction transistor device may include a floating collector, in which case the bipolar junction transistor device may be operated as a diode for improved emitter current.

8 Claims, 3 Drawing Sheets

ION IMPLANTATION AND PROCESS SEQUENCE TO FORM SMALLER BASE PICK-UP

CROSS-REFERENCE TO RELATED APPLICATIONS

The present application is a divisional of non-provisional application Ser. No. 12/056,052, filed Mar. 26, 2008, entitled "ION IMPLANTATION AND PROCESS SEQUENCE TO FORM SMALLER BASE PICK-UP," now U.S. Pat. No. 7,807,539, issued Oct. 5, 2010, which claims priority to U.S. Provisional Patent Application No. 60/908,026, filed Mar. 26, 2007, the entire specifications of which are hereby incorporated by reference in their entireties for all purposes, except for those sections, if any, that are inconsistent with this specification

TECHNICAL FIELD

Embodiments of the present invention relate to the field of microelectronics, in particular, to bipolar junction transistors.

BACKGROUND

The demand for increasingly smaller devices has posed a number of challenges at least in terms of manufacturing. One area in particular is memory devices including arrays of transistors including, for example, bipolar junction transistors (BJTs). Certain aspects of BJTs may inhibit their continued decrease in size. For example, a BJT may include an emitter region including a number of emitter fingers, the emitter region sharing a common base. For forming the base pick-up, a region of the base is usually implanted. In order to prevent implant interference, in which dopants intended for the base pick-up region stray into the emitter region, isolation trenches between an emitter region and a base pick-up region usually must have a minimum width. Reducing the minimum width may unfortunately have the detrimental effect of implant interference, which may affect the performance of the BJT device.

SUMMARY OF THE INVENTION

In view of the problems in the state of the art, embodiments of the invention are directed to methods for forming BJT devices having a reduced isolation trench width and/or decreased implant interference. More specifically, with the foregoing and other items in view, there is provided, in accordance with various embodiments of the invention, a method comprising providing a substrate including a collector layer, a common base layer formed over the collector layer, and a top layer formed over the common base layer; doping a first portion of the top layer with a first dopant to form a base pick-up region; and after doping the first portion of the top layer, doping a second portion of the top layer with a second dopant to form at least one emitter region; wherein the first dopant is different from the second dopant.

In various embodiments, an isolation trench may be formed between the first portion and the second portion of the top layer. In some embodiments, a plurality of isolation trenches may be formed in the top layer to define a plurality of regions of the top layer. In some of these embodiments, doping a second portion of the top layer may comprise doping the plurality of regions with a second dopant to form a corresponding plurality of emitter regions.

In various embodiments, the first dopant may be an N-type dopant and the second dopant may be a P-type dopant. In some embodiments, the first dopant comprises a selected one of arsenic and antimony. In various embodiments, the second dopant may comprise a selected one of boron, aluminum, gallium, or indium.

In various embodiments, a first photoresist layer may be formed over the top layer and may be patterned the first photoresist layer to reveal the first portion of the top layer. In some of these embodiments, doping a first portion may comprise doping the revealed first portion of the top layer. The first photoresist layer may be stripped after doping the revealed first portion. A second photoresist layer may be formed over the top layer after stripping the first photoresist layer and patterned to reveal the second portion of the top layer. In various ones of these embodiments, doping the second portion of top layer may comprise doping the revealed second portion of the top layer.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to methods for forming a BJT device having a minimized spacing for an isolation trench between a base pick-up and the emitter region, which may result in an overall reduction in size for the BJT device relative to various prior art devices. In some embodiments, in addition to or alternatively to minimizing the spacing for the isolation trench, implant interference may be minimized or avoided. More particularly, counter-doping of an already-doped emitter region, resulting from scattering of dopants used for an implantation operation for forming the base pick-up, may be minimized or avoided.

Figure 1:
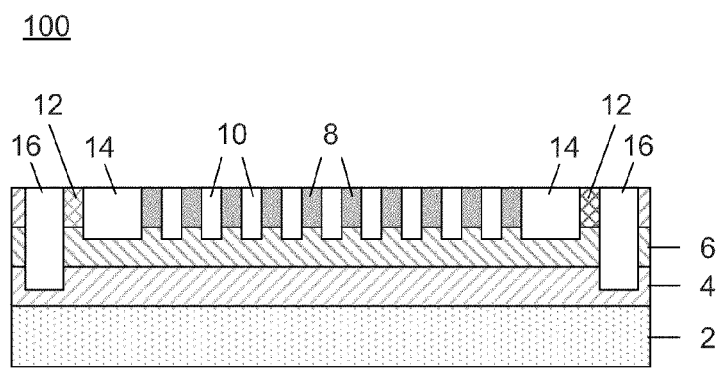
FIG. 1 illustrates a cross-sectional view of prior art BJT device.

Various embodiments of the present invention may be more easily understood in the context of the prior art. Turning to FIG. 1, illustrated is an exemplary prior art BJT device 100 formed using various prior art methods. BJT device 100 includes a substrate 2, a collector layer 4 formed over substrate 2, a base layer 6 formed over collector layer 4, and emitter regions 8, separated by isolation regions 10, formed over base layer 6. As illustrated, base layer 6 is a common-base structure, with emitter regions 8 sharing base layer 6 so that emitter regions 8 form corresponding NPN transistor devices. BJT device 100 further includes two base pick-ups 12, separated from emitter regions 8 by isolation trenches 14 and bounded by other isolation trenches 16.

As noted herein, implantation of base pick-ups 12 has sometimes been known to result in scattering of dopants into emitter regions 8. Such implantation interference may dictate the width of isolation trenches 14. Isolation trenches 16 may be configured to isolate BJT device 100 from other devices and so in some cases, as illustrated, isolation trenches 16 may also require an increased width. These widths may affect the overall device size, and thus may limit the degree to which the device may be minimized.

Figure 2:
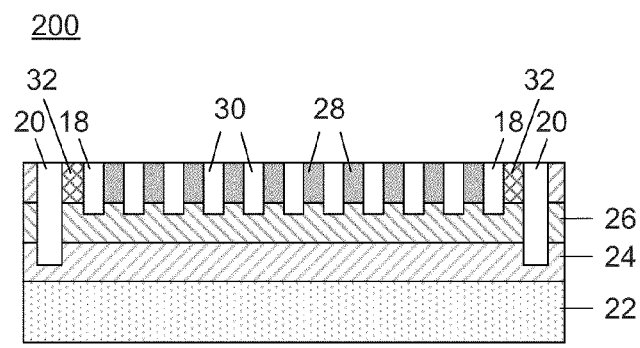
FIG. 2 illustrates a cross-sectional view of a BJT device formed using a method in accordance with various embodiments of the present invention.

In various embodiments of the present invention, isolation trench widths may advantageously be minimized, which may result in a reduced overall device size. In some embodiments, implant interference may be minimized in addition to, or alternatively, minimization of isolation trench widths. As illustrated in FIG. 2, for example, the illustrated BJT device 200 has an overall width that is narrower than BJT device 100 illustrated in FIG. 1. This narrowing is due at least in part to narrowing of isolation trenches 18 and also isolation trenches 20.

As illustrated, BJT device 200 may include a substrate 22 including a collector layer 24, a common base layer 26 formed over collector layer 24, and emitter regions 28 formed over common base layer 26. Emitter regions 28 may be separated by isolation regions 30, formed over base layer 26. As illustrated, base layer 26 is a common-base structure, with emitter regions 28 sharing base layer 26 so that emitter regions 28 form corresponding NPN transistor devices. BJT device 200 further includes two base pick-ups 32, separated from emitter regions 28 by isolation trenches 18 and bounded by other isolation trenches 20. It is noted that in various embodiments, the collector region including collector layer 24 may be a floating collector, in which case BJT device 200 may be operated as a diode for improved emitter current relative to various related art devices.

Various stages of exemplary methods for forming BJT devices such as, for example, BJT device 200 of FIG. 2, are illustrated in FIGS. 3-10. For clarity, the same reference numerals used with respect to FIG. 2 are used in the discussion to follow with respect to FIGS. 3-10. Also, as noted herein, the various operations discussed and/or illustrated may be generally referred to as multiple discrete operations in turn to help in understanding embodiments of the present invention. The order of description should not be construed to imply that these operations are order dependent, unless explicitly stated. Moreover, some embodiments may include more or fewer operations than may be described.

Figure 3:
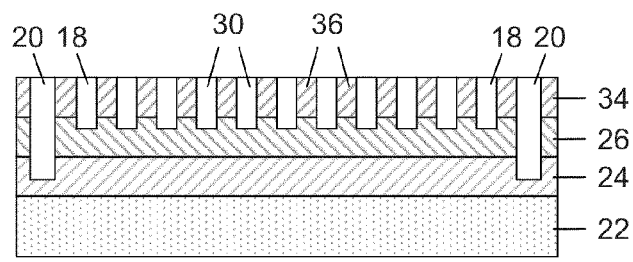
FIGS. 3-10 illustrate cross-sectional views of a BJT device (such as, e.g., the BJT device illustrated in FIG. 2) at various stages of a method in accordance with various embodiments of the present invention.

Turning now to FIG. 3, collector layer 24 and common base layer 26 are formed over substrate 22. Substrate 22 may comprise any substrate material suitable for the purpose including, for example, silicon.

A top layer 34 is formed over common base layer 26, top layer 34 comprising the layer in which emitter regions 28 may be later formed, as will become more evident in the discussion to follow. Isolation trenches 30 are formed in top layer 34 for defining regions 36 which later form emitter regions 28. Isolation trenches 18 and 20 are formed in top layer 34. With respect to isolation trenches 30, 18, and 20, any suitable material for isolating conductive regions may be used. For example, an oxide material may be suitable for many applications. Other isolation materials may be used including, for example, a nitride material.

Figure 4:
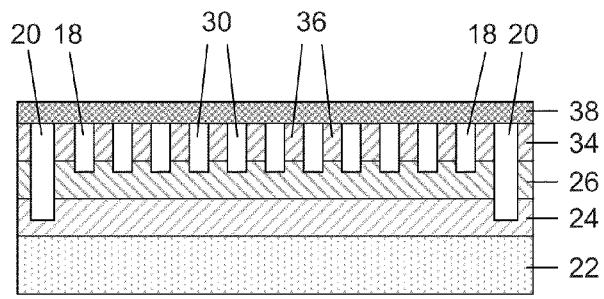
Figure 5:
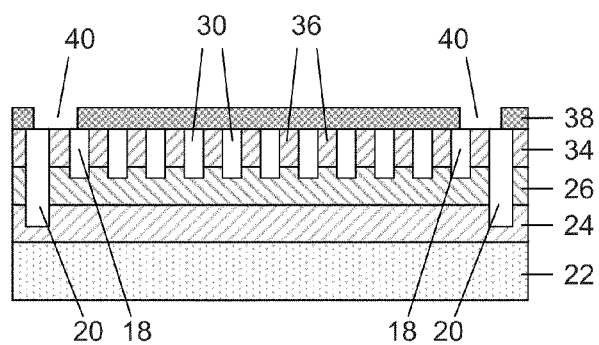

A photoresist layer 38 may be formed over top layer 34 as illustrated at FIG. 4, and then patterned as illustrated at FIG. 5, to reveal locations 40 at which base pick-ups 32 (see FIG. 2) may be later formed. A photoresist material suitable for forming photoresist layer 38 or any other photoresist layer described may be any radiation-sensitive material suitable for the purpose. Photoresist layers may be formed from a positive photoresist or a negative photoresist, depending on the application, and embodiments of the present invention are applicable to both. For the various embodiments described herein, positive photoresists are illustrated for simplicity. Further, photoresist materials used for forming photoresist layers for any one or more of various operations described herein may be exposed to any radiation, and for any amount of time, suitable to cause the photoresist material to be removable, at the exposed locations (or unexposed locations with negative photoresist), during a develop operation.

Figure 6:
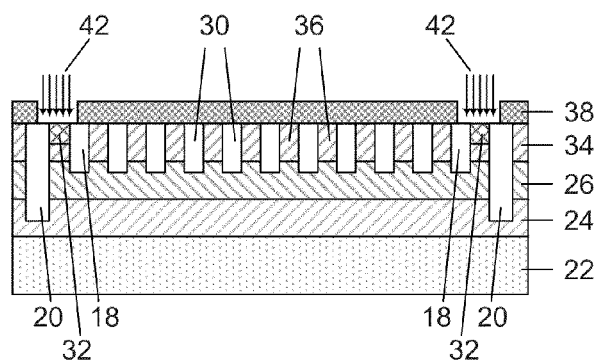

Revealed locations 40 may be doped for forming base pick-ups 32, as illustrated in FIG. 6. In various embodiments, N+ base pick-ups 32 may be formed by implanting top layer 34 using an N-type dopant 42. Suitable N-type dopants 42 may include dopants that are heavier than nitrogen or phosphorus, such that diffusion rate of the dopant is slower. For example, arsenic or antimony may be suitable N-type dopants. In one embodiment, for example, N-type dopant 42 comprises arsenic. Slower diffusion may result, in various embodiments, a decreased amount of diffusion into other portions of top layer 34 and/or base layer 26, referred to herein as implant interference.

In various embodiments, implant interference arising from scattering of the selected dopants 42 into other portions of top layer 34 and/or base layer 26 may be minimized, at least in part, as a result of using a low energy, high dose N+ implant, relative to various prior art methods. In various embodiments, a low energy, high dose N+ implant may result in a shallow doping of top layer 34, as illustrated in FIG. 6. The shallow doping may help minimize implant interference of other portions of top layer 34 and/or base layer 26. Although some migration of the dopants 42 may occur, in various embodiments, during the course of subsequent thermal processing (such as, e.g., annealing, etc.), the slower diffusion rate of the selected dopant 42 may help minimize an undesirable level of migration.

Figure 7:
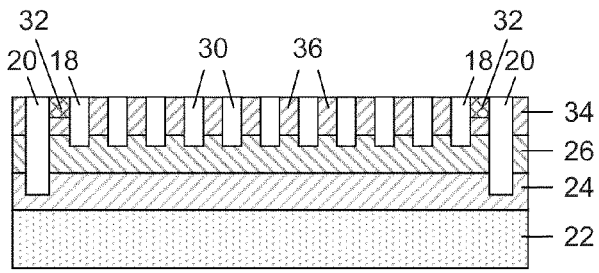
Figure 8:
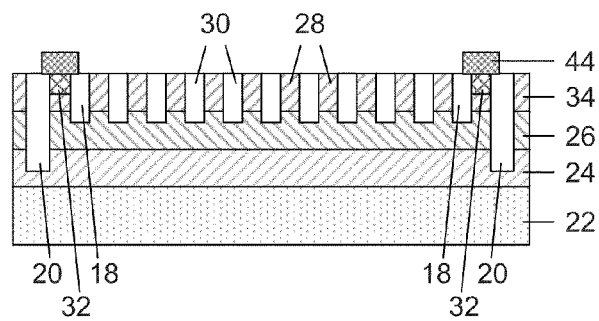

After doping top layer 34 to form base pick-ups 32, photoresist layer 38 may be stripped as illustrated at FIG. 7. Another photoresist layer 44 is formed on top layer 34 and patterned to reveal at least emitter regions and patterned onto top layer 34 to reveal regions 36 which later form emitter regions 28.

Figure 9:
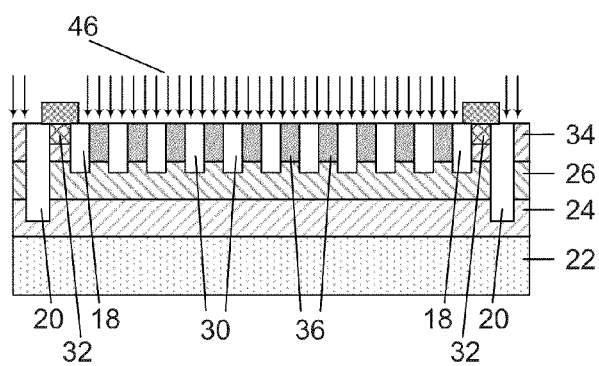

For forming emitter regions 28, revealed regions 36 may be doped, as illustrated in FIG. 9. In various embodiments, P+ emitter regions 36 may be formed by implanting top layer 34 using a P-type dopant 46. Suitable P-type dopant 46 may include boron, aluminum, gallium, or indium. In one embodiment, for example, P-type dopant 46 comprises boron.

Figure 10:
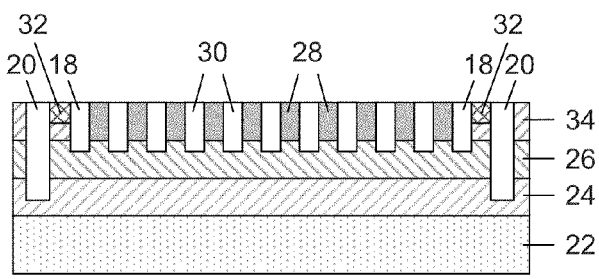

After doping top layer 34 to form emitter regions 28, photoresist layer 44 may be stripped as illustrated at FIG. 10. Although the resulting BJT device illustrated in FIG. 10 bears similarity to BJT device 200 of FIG. 2, the dopants of base pick-ups 32 are shallower than illustrated in FIG. 2. As noted herein, various process operations, including annealing, for example, may result in a slight migration of the dopants of base pick-ups 32. As the initial doping was shallow, however, the migration may not be detrimental to device performance.

In various embodiments, forming emitter regions 28 after forming base pick-ups 32 may result in enhanced device performance relative to devices wherein base pick-ups 32 are formed prior to forming emitter regions 28. In some embodiments, this may be due in part to the device being less affected by a slight counter-doping of base pick-ups 32 in contrast to counter-doping of emitter regions 28. Accordingly, methods in accordance with the present invention may advantageously form base pick-ups 32 before forming emitter regions 28.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   forming a first isolation trench in a substrate, the first isolation trench including (i) a first side and (ii) a second side opposite the first side;
   forming a first photoresist layer over the substrate;
   patterning the first photoresist layer to reveal the substrate on the first side of the first isolation trench;
   performing a shallow doping of the substrate revealed on the first side of the first isolation trench with a first dopant to form a base pick-up region, the shallow doping being performed such that doping of the second side of the first isolation trench with the first dopant is substantially avoided;
   doping the substrate on the second side of the first isolation trench with a second dopant to form at least one emitter region, the second dopant being different from the first dopant;
   stripping the first photoresist layer after having doped the substrate revealed on the first side of the first isolation trench;
   forming a second photoresist layer over the substrate after having stripped the first photoresist layer; and
   patterning the second photoresist layer to reveal the substrate on the second side of the first isolation trench.

2. The method of claim 1, further comprising:
   forming a plurality of second isolation trenches in the substrate on the second side of the first isolation trench, the plurality of second isolation trenches defining a plurality of regions,
   wherein doping the substrate on the second side of the isolation trench comprises doping the plurality of regions to form a corresponding plurality of emitter regions.

3. The method of claim 1, wherein:
   the first dopant is an N-type dopant; and
   the second dopant is a P-type dopant.

4. The method of claim 1, wherein the first dopant is a dopant selected from the group consisting of arsenic and antimony.

5. The method of claim 4, wherein the first dopant is arsenic.

6. The method of claim 1, wherein the second dopant is a dopant selected from the group consisting of boron, aluminum, gallium, and indium.

7. The method of claim 6, wherein the second dopant is boron.

8. The method of claim 1, wherein:
   doping the substrate on the second side of the first isolation trench comprises doping the substrate revealed on the second side of the first isolation trench.

* * * * *